(12) United States Patent
Fant et al.

(10) Patent No.: US 8,358,164 B2
(45) Date of Patent: Jan. 22, 2013

(54) SQUARE WAVE SIGNAL COMPONENT CANCELLATION

(75) Inventors: Andrea Fant, Nimis (IT); Luca Sant, Tarcento (IT); Patrick Vernei Torta, Villach (AT)

(73) Assignee: Infineon Technologies AG, Neubiberg (DE)

( * ) Notice: Subject to any disclaimer, the term of this patent is extended or adjusted under 35 U.S.C. 154(b) by 140 days.

(21) Appl. No.: 12/956,358

(22) Filed: Nov. 30, 2010

(65) Prior Publication Data

US 2012/0133412 A1 May 31, 2012

(51) Int. Cl.
*H03L 5/00* (2006.01)
(52) U.S. Cl. ........................................ 327/307
(58) Field of Classification Search .................... 327/307
See application file for complete search history.

(56) References Cited

U.S. PATENT DOCUMENTS

| | | | | |
|---|---|---|---|---|
| 5,566,213 A * | 10/1996 | Carsello | ......................... | 375/344 |
| 6,801,581 B1 * | 10/2004 | Francos et al. | ................. | 375/296 |
| 7,167,530 B2 * | 1/2007 | Koomullil et al. | ............ | 375/329 |
| 7,221,918 B1 * | 5/2007 | Grasbeck et al. | ........... | 455/251.1 |
| 7,403,760 B1 * | 7/2008 | Gao | ............... | 455/312 |
| 7,583,765 B2 * | 9/2009 | Beamish | ........................ | 375/346 |
| 7,893,787 B2 * | 2/2011 | Walkington | ................... | 332/103 |
| 2006/0227910 A1 * | 10/2006 | Ramasubramanian et al. | .............................. | 375/346 |
| 2007/0281655 A1 * | 12/2007 | Ishikawa et al. | ............... | 455/296 |
| 2009/0261918 A1 * | 10/2009 | Walkington | ................... | 332/103 |

OTHER PUBLICATIONS

U.S. Appl. No. 12/956,324, filed Nov. 30, 2010.

* cited by examiner

*Primary Examiner* — Lincoln Donovan
*Assistant Examiner* — William Hernandez
(74) *Attorney, Agent, or Firm* — Eschweiler & Associates, LLC (57) ABSTRACT

Some embodiments of the invention a circuit configured to apply a time domain processing sequence to a modulated input signal to estimate a mean value of the modulated input signal and to subtract the estimated mean value from the modulated input signal, thereby removing the DC offset from the input signal. In one particular embodiment, the time domain processing sequence is based on integration and differentiation of a demodulated output signal. In such an embodiment, a circuit is configured to integrate a demodulated signal to generate an integrated signal having a triangular shaped output signal. The circuit then measures the slopes of the integrated signal, by differentiation of the triangular shaped integrated signal, and generates an appropriate DC offset correction signal based upon the measured slopes. The DC offset correction signal may be added on top of the actual input signal to cancel the unwanted DC offset component.

21 Claims, 7 Drawing Sheets

SQUARE WAVE SIGNAL COMPONENT CANCELLATION

REFERENCE TO RELATED APPLICATION

This application relates to U.S. patent application Ser. No. 12/956,324 filed on Nov. 30, 2010.

BACKGROUND

Modulation (i.e., the generation of modulated signals) allows for the transmission of data over transmission medium such as radio waves by impressing data onto a carrier wave by varying the amplitude, frequency, phase, or other characteristics of the carrier wave. Therefore, modulated signals play an important role in wireless communication that is widely used today. For the communication process to be completed the original information is extracted from the modulated carrier wave through a demodulation process.

In various situations a modulated signal may comprise a DC offset in addition to a modulated signal component. For example, sensors configured to detect a physical attribute (e.g., proximity, acceleration, etc.) may comprise a DC offset due to ambient data sources. Similarly, a baseband signal may comprise a DC offset which is introduced by hardware during the course of the baseband signal's transmission across a network.

DRAWINGS

FIG. 3b shows exemplary signal diagrams illustrating operation of the DC offset circuit of FIG. 3a.

FIG. 4b shows exemplary signal diagrams illustrating operation of the DC offset circuit of FIG. 4a.

DETAILED DESCRIPTION

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details.

It will be appreciated that as described herein, the term subtraction is intended to encompass both the operation of subtraction of two signals and the addition of a signal with a second signal having an inverted polarity. For example, subtraction of two signals is intended to encompass both the operation of subtracting a first signal (e.g., a DC offset correction signal) from a second signal (e.g., an input signal) and addition of a negative first signal (e.g., a negative DC offset correction signal) and a second signal (e.g., an input signal).

The demodulation of a modulated input signal may also bring about the modulation of DC signal components (e.g., DC offsets) comprised within the modulated input signal, if present. The modulation of such DC signal components generates unwanted modulated signal components that can lead to a degradation of the system performance (e.g., by folding products or by direct contribution to measurement error). Accordingly, DC signal components of a modulated input signal are therefore typically removed prior to demodulation.

However, the removal of a DC signal component typically requires additional analog or digital blocks that increase complexity, area, and power consumption resulting in circuits having a high complexity and poor area efficiency. For example, the cancellation or extraction of a DC signal component from a modulated input signal can be performed using either analog solutions (e.g., demodulation at known sinusoidal carrier frequency/phase, bandpass filtering of relevant frequency bands) or digital solutions (e.g., filtering of relevant tones or frequency bands after ND conversion), both of which utilize complex circuitry.

Figure 1:
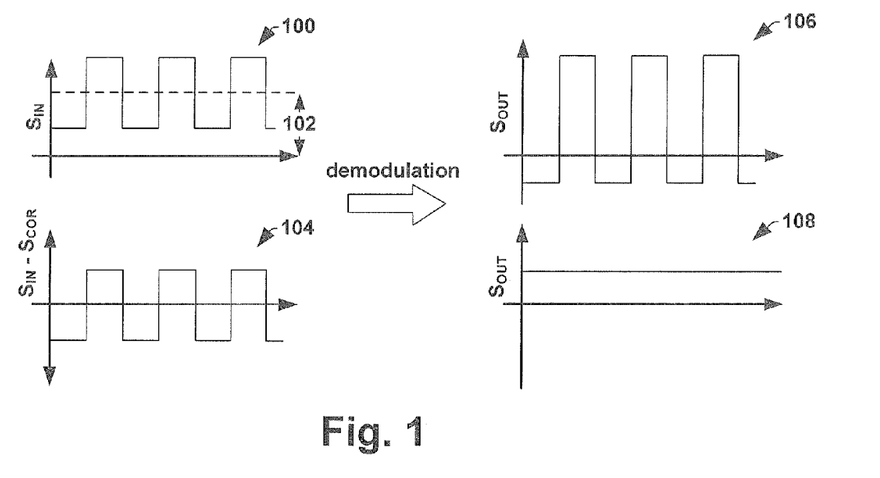
FIG. 1 illustrates graphs showing the modulation of a first signal having a DC offset and a modulated component and a second signal having a modulated component without a DC offset.

The inventors have appreciated that the output of a modulation circuit will depend on whether or not there is a DC offset component present in a signal input to the modulation circuit. For example, as shown in FIG. 1, the demodulation of an input signal $S_{IN}$ 100 having a DC offset 102 results in an output signal 106 having a modulated signal component (e.g., a signal component having a positive and negative polarity). In contrast, demodulation of an input signal 104 corrected to remove the DC offset $S_{IN}-S_{COR}$ results in an output signal $S_{OUT}'$ 106 having an un-modulated (e.g., flat) signal at the output of the modulation circuit. Therefore, removing the DC offset from an input signal provided to a modulation circuit results in an output signal not having modulated components.

Based upon this appreciation, a method and apparatus for removing a direct current (DC) offset component from a modulated waveform in power and area efficient way are provided herein. More particularly, as provided herein a circuit is configured to apply a time domain processing sequence to a modulated input signal to estimate a DC offset of an input signal having a DC offset based upon modulated components of a signal output from a modulation circuit (e.g., the modulated DC offset present in the input signal). The estimated DC offset is output from a feedback loop, as a correction signal, to an adder that is configured to subtract the correction signal from the input signal, thereby removing the DC offset from the input signal. Therefore, the circuit estimates the DC offset component of the input signal by measuring the modulated component of the signal (e.g., the modulated DC offset) output from a modulation circuit and iteratively corrects the input signal until the modulated component of the output signal, from the modulation circuit, is removed.

In one particular embodiment, the time domain processing sequence is based on integration (e.g., integration, approximate integration) and differentiation of an output signal generated by a modulation circuit. In such an embodiment, a time domain DC offset correction circuit is configured to integrate an output signal to generate an integrated signal having a triangular shaped output signal. The circuit then measures the slopes of the integrated signal, by differentiation of the triangular shaped integrated signal, and generates an appropriate DC offset correction signal based upon the measured slopes. The DC offset correction signal may be subtracted from the actual input signal to cancel the unwanted DC offset component.

Figure 2:
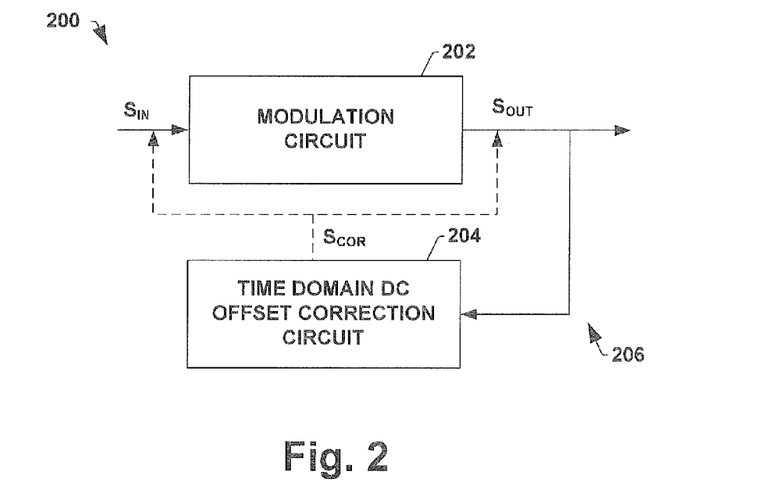
FIG. 2 illustrates a block diagram of a circuit configured to measure a DC offset of a modulated input signal and to correct the input signal using the measured DC offset.

FIG. 2 illustrates a block diagram of a first embodiment of a DC offset correction circuit 200 configured to measure a DC offset of an input signal $S_{IN}$ and to remove the DC offset of the input signal $S_{IN}$. The circuit 200 comprises a modulation circuit 202 configured to receive an input signal $S_{IN}$ (e.g., directly or via an adder) having a modulated component and a DC offset component. The modulation circuit 202 demodulates the input signal $S_{IN}$ to generate an output signal $S_{OUT}$. Since a DC offset is present in the input signal $S_{IN}$, the modulation circuit 202 modulates the DC offset signal to generate a modulated signal component within the output signal $S_{OUT}$. Therefore, the output signal $S_{OUT}$ comprises a demodulated component (from the modulated component of the input signal) and a modulated component (from the DC offset component of the input signal).

The output signal $S_{OUT}$ is provided to a feedback loop 206 comprising a time domain DC offset correction circuit 204. The time domain DC offset correction circuit 204 comprises one or more circuit components configured to estimate the DC offset component of the input signal $S_{IN}$ based upon the modulated component of the output signal $S_{OUT}$ using a time domain processing sequence of the output signal.

The feedback loop 206 is configured to provide a DC offset correction signal $S_{COR}$, comprising an estimated DC offset component, to remove the DC offset of the input signal. In one embodiment, the DC offset correction signal $S_{COR}$ (e.g., a DC offset correction signal having a constant DC value) is subtracted from the input signal $S_{IN}$ to remove the DC offset component of the input signal. In an alternative embodiment, the DC offset correction signal $S_{COR}$ (e.g., a DC offset correction signal having a modulated value) is subtracted from output signal $S_{OUT}$ to remove the DC offset component of the input signal.

In general, estimation of the DC offset component as provided herein is an iterative process. Therefore, the actual DC offset component of an input signal may be estimated over a plurality of feedback cycles, wherein in each feedback cycle the estimated DC offset component iteratively approaches the actual DC offset component of the input signal. The iterative operation of the circuit allows for the circuit to correct for changing DC offsets of an input signal in real time. For example, if the DC offset of an input signal changes, a modulated DC offset component (e.g., a square wave) will appear in the output of the modulation circuit for a short time until the feedback loop reacts and suppresses it again. Furthermore, the iterative nature of the DC offset correction circuit allows for high resolution to be achieved when the circuit is allowed to correct the DC offset over an extended period of time.

It will be appreciated that the DC offset correction circuits provided herein may provide correction for a wide range of actual DC offset values. For example, the actual DC offset present in the input signal may comprise a large DC offset value in one embodiment, while in an alternative embodiment the actual DC offset present in the input signal may comprise a small DC offset value. Therefore, the term DC offset, as provided herein, does not denote a particular size of DC offset value but rather is applicable to any DC offset value that may be present in an input signal.

Figure 3A:
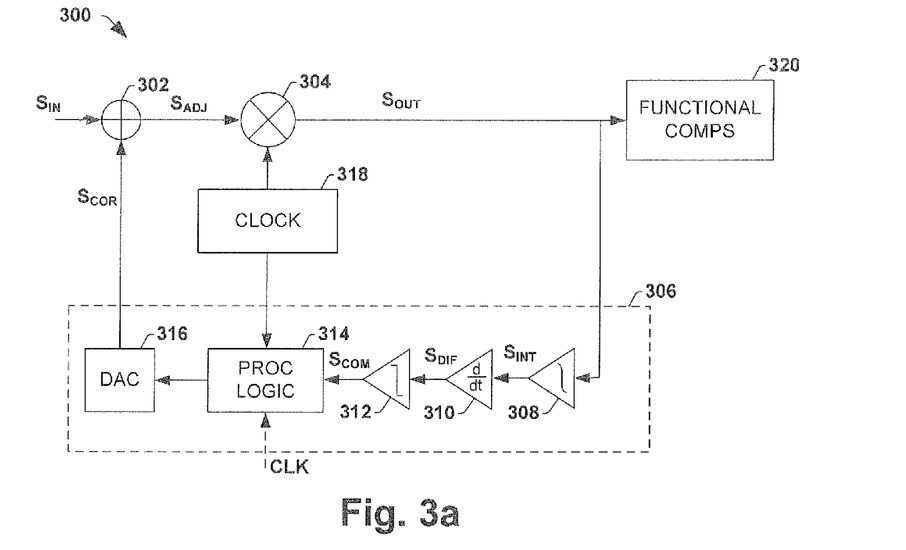
FIG. 3a illustrates a DC offset correction circuit wherein an adder configured to subtract a DC offset correction signal from an input signal is located upstream of the modulation circuit.

FIG. 3a illustrates a more detailed embodiment of a DC offset correction circuit 300, wherein an adder 302 is configured to remove the DC offset of the input signal $S_{IN}$ by subtracting a DC offset correction signal (e.g., having a constant DC value) from an input signal located upstream of a modulation circuit 304. As shown in FIG. 3a, a feedback loop comprises a time domain DC offset correction circuit 306 configured to apply a time domain processing sequence to estimate a DC offset of an input signal comprises an integration component 308, a differentiator 310, a comparator 312, and a digital-to-analog converter (DAC) 316. The feedback loop is closed by connecting the output of the DAC 316 to an adder 302 configured to subtract the estimation of the DC offset from the input signal $S_{IN}$ and thereby generate a bipolar adjusted input signal $S_{ADJ}$.

More particularly, an input signal $S_{IN}$ having a modulation component and a DC offset component is provided to a modulation circuit 304 that is configured to generate an output signal $S_{OUT}$ as described above. The output signal $S_{OUT}$, having a demodulated component (from the modulated component of the input signal) and a modulated component (from the DC offset component of the input signal), is provided directly to an integration component 308.

The integration component 308 is configured to integrate or approximately integrate the output signal $S_{OUT}$ and output an integrated signal $S_{INT}$. If a DC offset is present in the input signal $S_{IN}$, the integration component 308 generates an integrated signal comprising a triangular waveform. In various embodiments, the integration component 308 may comprise a variety of integrating circuits. For example, in one embodiment, the integration component 308 may comprise an integrator. In an alternative embodiment, the integration component may comprise one or more low pass filters configured to approximate integration of the output signal $S_{OUT}$.

The output of the integration component 308 is provided to a differentiator 310 configured to determine the slope of the integrated signal $S_{INT}$ by differentiating the signal in time. In one embodiment, wherein a DC offset is present in the input signal $S_{IN}$ the differentiator 310 differentiates the triangular waveform of the integrated signal $S_{INT}$ to result in a differentiated signal $S_{DIF}$ having a square waveform that alternates between a positive value and a negative value (e.g., positive value when the integrated signal has a positive "upward" slope, and a negative value when the integrated signal has a negative "downward" slope).

A comparator 312 is configured to receive the differentiated signal $S_{DIF}$ from the differentiator 310 and therefrom to generate a comparator signal $S_{COM}$ that indicates what slope is present in the integrated signal $S_{INT}$ and therefore whether or not a DC offset component is present in the input signal $S_{IN}$. The comparator signal $S_{COM}$ may be provided to processing logic 314, which determines from the comparator signal $S_{COM}$ if a correction is needed to remove the DC offset from the input signal $S_{IN}$.

For example, in one embodiment if the integrated signal $S_{INT}$ has a positive slope (e.g., if the DC offset of the input signal has a positive value, the integrated signal will increase) the comparator signal $S_{COM}$ indicates to the processing logic 314 that a negative correction is to be made to the DC offset of the input signal $S_{IN}$ (e.g., modified comparator signal $S_{COM}'$ will be positive, in general, for a larger percentage of time than negative, as described below). At some point in time, when the DC offset of the input signal $S_{IN}$ becomes nulled (i.e., substantially equal to 0), the integrated signal $S_{INT}$ will be substantially flat and the processing logic 314 will not be able to determine from the comparator signal $S_{COM}$ if the slope is positive or negative (e.g., modified comparator signal $S_{COM}'$ will be 50% of the time positive, 50% of the time negative, as described below). From this point in time the system is in a stable equilibrium condition and the output of comparator 312 will correspond to a zero mean random signal. Therefore, it will not influence the mean value of the applied correction.

It will be appreciated that consistency between the sign of comparator signal $S_{COM}$ relative to the phase of the mixer allows for proper correction to the input signal $S_{IN}$. For example, if the phase of the mixer changes (e.g., the sign of the output signal $S_{OUT}$ from the mixer changes), the comparator signal $S_{COM}$ also has to switch polarity to prevent the sign of the correction signal $S_{COR}$ from changing and causing the system to become unstable. Consistency between the sign of the comparator signal $S_{COM}$ and the phase of the mixer can be accomplished in two ways: by operating the processing logic in a single phase of the mixer, or by causing the processing logic to multiply the comparator signal $S_{COM}$ by the mixer clock.

In one embodiment wherein the processing logic is operated in a single phase of the mixer, the processing logic 314 takes into account the comparator signal $S_{COM}$ in a single phase of the mixer (e.g., in the positive phase of the mixer) so that the phase of the mixer is the same during processing. In an alternative embodiment wherein the processing logic multiplies the comparator signal $S_{COM}$ by the output of clock 318, the processing logic 314 comprises a combinatorial logic that multiplies the output of the comparator $S_{COM}$ (e.g., a "1" or a "0") by the phase of the mixer (e.g., with the output of clock 318) to generate a modified comparator signal. In such an embodiment, the processing logic 314 may be clocked by the reference clock of the mixer (i.e., the processing logic multiplies the $S_{COM}$ with the mixer clock) so that it can multiply the comparator signal $S_{COM}$ with different phases of the modulation circuit 304 (e.g., with the phase of the output signal $S_{OUT}$).

The processing logic 314 may provide a digital signal (e.g., a sequence of digital code) indicating an estimated DC offset value to a digital-to-analog converter (DAC) 316. In one embodiment, the DAC 316 may comprise a charge pump that is configured to generate a charge based upon the digital signals output from the processing logic 314. The DAC 316 is configured to generate a correction signal $S_{COR}$ comprising an analog representation of the estimated DC offset value based upon the digital code received.

The analog correction signal $S_{COR}$ is provided to the adder 302, configured upstream of the modulation circuit 304. The adder subtracts the correction signal $S_{COR}$ from the input signal $S_{IN}$ to remove the DC offset of the input signal $S_{IN}$ and to generate a bipolar adjusted signal $S_{ADJ}$ that is provided to the modulation circuit 304.

If the correction signal $S_{COR}$ fails to generate an acceptable adjusted signal $S_{ADJ}$ (e.g., an adjusted signal having a DC offset that results in a bipolar signal), it may be further adjusted during subsequent feedback cycles. For example, the DC offset of the input signal $S_{IN}$ may be reduced by discretely adjusting the correction signal $S_{COR}$ until the DC offset of the input signal $S_{IN}$ is substantially removed. This process could also continue indefinitely if the system expects a changing DC offset at the input and would continuously correct for it.

Alternatively, once the DC offset is removed/minimized the value of the correction signal provided at the DAC's output (e.g., output voltage, output current) may be held at a constant value to cancel the estimated DC offset of the input signal $S_{IN}$ so that the bipolar adjusted signal may be provided to an activated demodulation circuit. Since the modulated adjusted input signal is bipolar, performance of the system may be improved through optimization of the system's dynamic range.

Figure 3B:
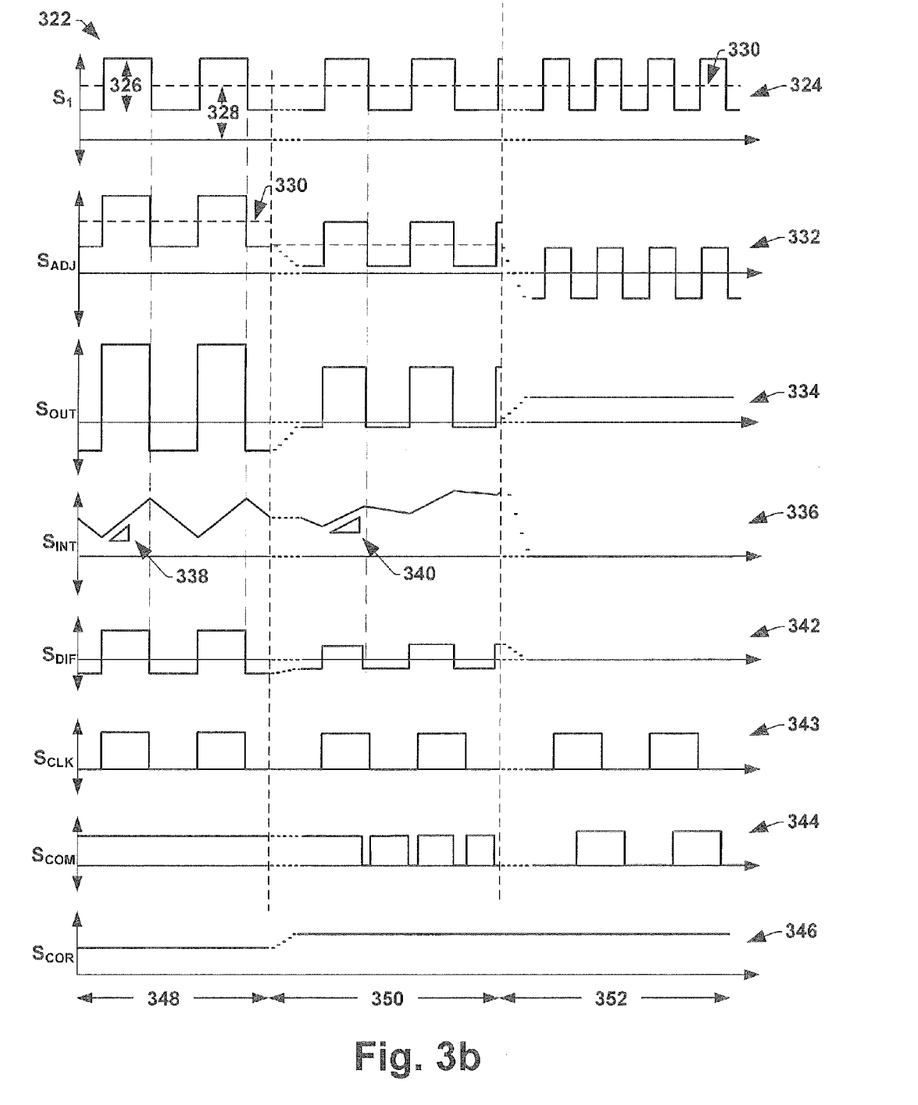

FIG. 3b illustrates exemplary signal diagrams associated with the operation of the DC offset correction circuit 300 illustrated in FIG. 3a. The signal diagrams show how the circuit 300 transforms the square waveform of the modulated component of the output signal (e.g., the modulated DC offset) to a DC offset correction signal $S_{COR}$ having an estimated DC offset. Furthermore, FIG. 3b illustrates generation of the correction signal $S_{COR}$ over three different feedback cycles (e.g., 348, 350, and 352) to illustrates how the triangular waveform of the integration signal $S_{INT}$ disappears if there is no rectangular modulated component in the signal $S_{OUT}$ output from the modulation circuit.

Graph 324 illustrates an input signal $S_{IN}$ to the circuit 300. The input signal $S_{IN}$ comprises a modulated component 326, a DC offset 328, and a mean value 330.

Graph 332 illustrates the adjusted signal $S_{ADJ}$ output from the adder 302. If no correction signal $S_{COR}$ is present in the initial feedback cycle of operation, the adjusted signal $S_{ADJ}$ output from the adder 302 is the same as the input signal $S_{IN}$.

Graph 334 illustrates the signal $S_{OUT}$ output from the modulation circuit 304. If a DC offset is present in the adjusted signal $S_{ADJ}$, the output of the modulation circuit 304 will comprise a modulated signal component (e.g. a signal component configured to change between a first value and a second value different than the first value).

Graph 336 illustrates the integrated signal $S_{INT}$ output from the integration component 308. In particular, the integrated signal $S_{INT}$ will comprise a positive slope when the demodulated output signal comprises a positive polarity and a negative slope when the demodulated output signal comprises a negative polarity.

Graph 342 illustrates the differentiated signal $S_{DIF}$ output from the differentiator 310. The differentiated signal $S_{DIF}$ indicates the slope of the integrated signal $S_{INT}$. For example, the differentiator 310 may differentiate the triangular shaped waveform of the integrated signal $S_{INT}$ resulting in a differentiated signal $S_{DIF}$ comprising a square waveform having a positive polarity when the slope of the integrated signal $S_{INT}$ is positive (e.g., when the demodulated output signal is above the mean value of the input signal) and a negative polarity when the slope of the integrated signal $S_{INT}$ is negative (e.g., when the demodulated output signal is below the mean value of the input signal).

Graph 344 illustrates the modified comparator signal $S_{COM}'$ comprising the output of the comparator 312 multiplied by the output of the mixer clock 318 (e.g., graph 343) (e.g., the comparator signal as processed by the processing logic). The modified comparator signal $S_{COM}'$ shown in graph 344 provides a constant value when a slope is present in $S_{INT}$ (e.g., as shown in feedback cycle 348 and 350) and provides a varying value (e.g., as shown in feedback cycle 352) when no slope is present in $S_{INT}$. For example, in feedback cycle 348, the multiplying the signal output from comparator 312 by the mixer clock signal 343 will result in a modified comparator signal $S_{COM}'$ that has a non-even distribution of positive and negative values (e.g., that is positive a greater percentage of time than it is negative), indicating a positive slope of the integrated signal $S_{INT}$. In one embodiment, the output of the comparator 312 may be generated by comparing the output of the differentiator to a predetermined value (e.g., "0") and therefore is directly proportional to the differentiated signal 343. When the DC offset of the input signal $S_{IN}$ becomes nulled (e.g., as shown in feedback cycle 352), the integrated signal $S_{INT}$ will be substantially flat (e.g., will have small variations that cannot be detected by a comparator rising and falling within a mixer clock cycle) resulting in a $S_{COM}'$ having a substantially even distribution of positive and negative values (e.g., that is 50% of the time positive and 50% of the time negative). In such a case, the processing logic 314 will not be able to determine if the slope is positive or negative from such a modified comparator signal and accordingly will hold the correction signal constant, detecting that the system is in a stable equilibrium condition.

Graph 346 illustrates the DC offset correction signal $S_{COR}$ output from the DAC 316. The DC offset correction signal $S_{COR}$ is generated by the DAC 316 to have an amplitude that is indirectly based upon the output of the comparator 312.

FIG. 3b also illustrates the potentially iterative operation of the circuit 300 that may cause the circuit 300 to correct for the DC offset of the input signal over a plurality of feedback cycles (e.g., 348, 350, and 352). As shown in FIG. 3b, during a first feedback cycle 348 a first correction signal value is determined. The first correction signal value is subtracted from the input signal $S_{IN}$ to result in an adjusted signal $S_{ADJ}$ (graph 332, feedback cycle 350) having a smaller DC offset. The smaller DC offset of the adjusted signal $S_{ADJ}$ in feedback cycle 350 results in a smaller variation of the integrated signal $S_{INT}$ (e.g., slope 340 is smaller than slope 338, temporal variation in cycle 350 is smaller than cycle 348). However, since a DC offset is still present in the adjusted signal $S_{ADJ}$, the modified comparator signal indicates that a further update to the correction signal $S_{COR}$ is to be made (e.g., $S_{COR}$ is increased to a second value). The updated correction signal $S_{COR}$ is then subtracted from the input signal $S_{IN}$. At some point in time (feedback cycle 352) the variation on $S_{INT}$ gets small enough that a positive and negative slope become substantially zero (and any positive or negative variations happen in the same mixer cycle) to result in an adjusted signal $S_{ADJ}$ (graph 332, feedback cycle 352) having no DC offset. Since the updated correction signal $S_{COR}$ removes the DC offset from the input signal $S_{IN}$, no modulated component is present in the output signal $S_{OUT}$ during the third feedback cycle 352. This causes the integrated signal $S_{INT}$ to have a zero slope causing the correction signal $S_{COR}$ to be held constant.

Figure 4A:
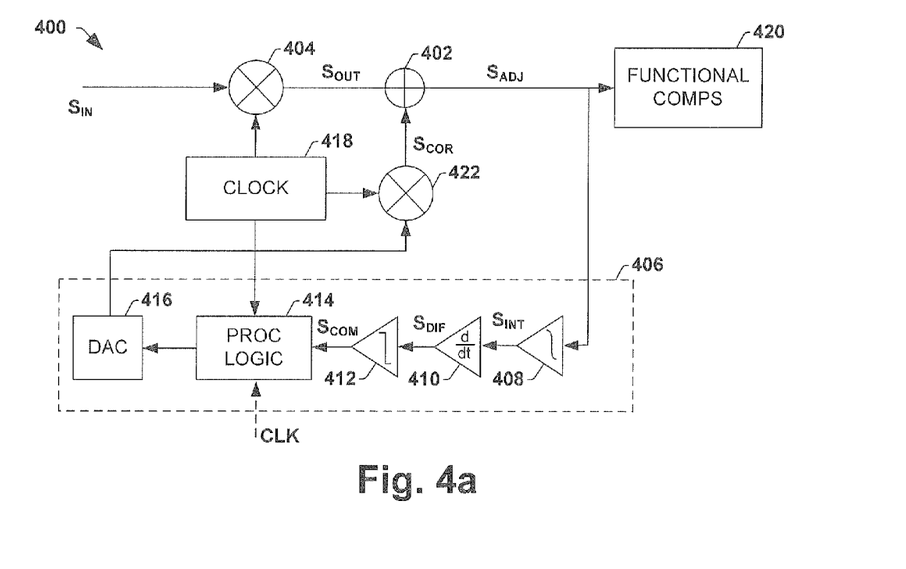
FIG. 4a illustrates a DC offset correction circuit wherein an adder configured to subtract a DC offset correction signal from an input signal is located downstream of the modulation circuit.

FIG. 4a illustrates an alternative embodiment of a DC offset correction circuit 400, wherein an adder 402 is configured to remove the DC offset of the input signal $S_{IN}$ by subtracting a DC offset correction signal $S_{COR}$ (e.g., having a modulated value) from a modulation circuit output signal $S_{OUT}$. Therefore, as shown in FIG. 4a, the circuit 400 is configured to remove the DC offset of the input signal $S_{IN}$ by subtracting a modulated DC offset correction signal $S_{COR}$ from the demodulated output signal $S_{OUT}$ (e.g., having a modulated DC offset component) output from the modulation circuit 404.

For example, as shown in FIG. 4a, the output of the DAC 416 is provided to an additional modulation circuit 422. The modulation circuit 422 is configured to receive the output of the DAC 416, comprising a constant DC offset estimation value, and modulate it to generate a correction signal $S_{COR}$ comprising a modulated DC offset estimation value. The modulation circuit 422 will be clocked by mixer clock 418 so that the output of the DAC 416 is modulated with the same clock frequency as the input signal $S_{IN}$. Accordingly, the correction signal $S_{COR}$ output from the additional modulation circuit 422 is a modulated signal that may be provided to an adder 402 located downstream of the modulation circuit 404, wherein the adder is configured to subtract the modulated correction signal $S_{COR}$ from the output signal $S_{OUT}$ to cancel the modulated component of the output signal $S_{OUT}$ (e.g., the DC offset component of the input signal $S_{IN}$).

Figure 4B:
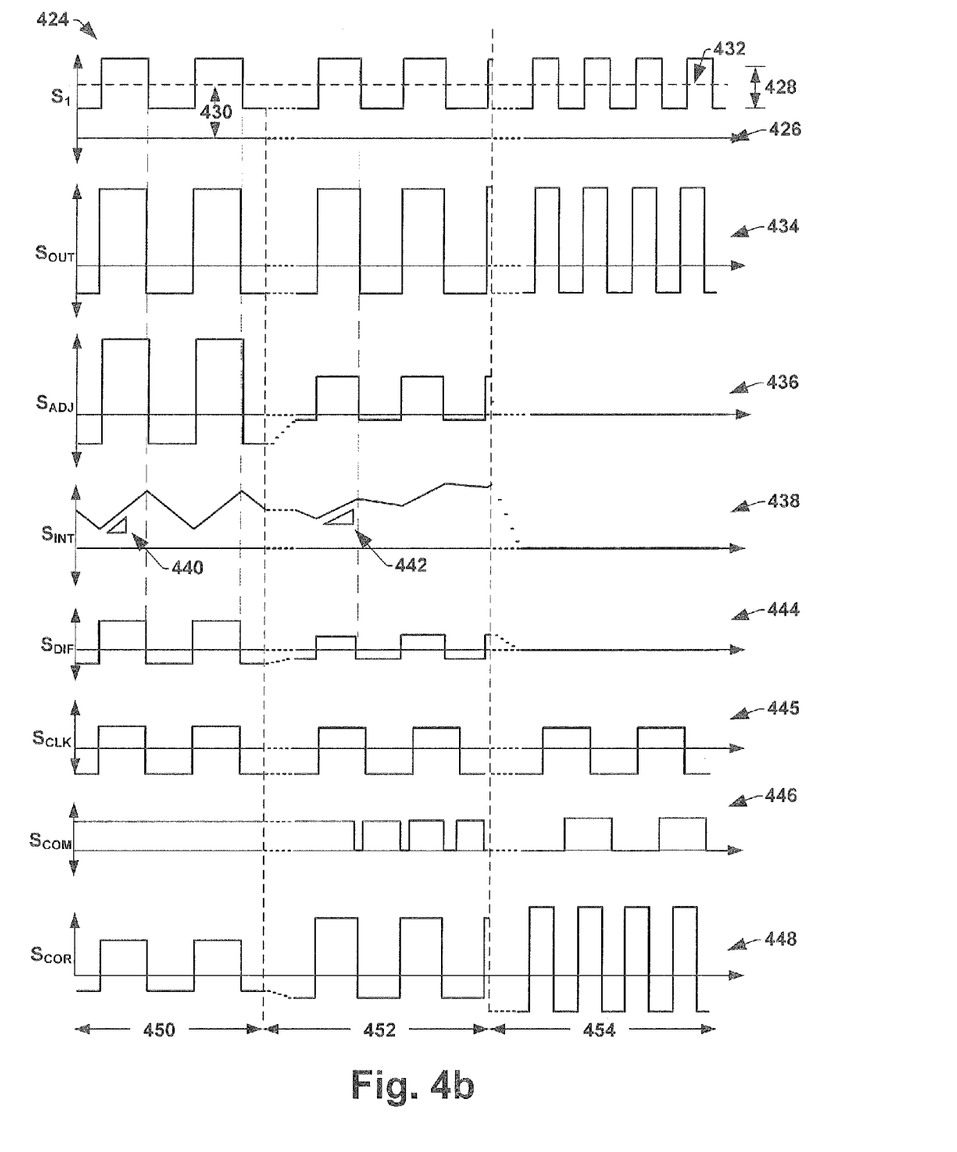

FIG. 4b illustrates exemplary signal diagrams associated with the operation of the DC offset correction circuit illustrated in FIG. 4a. As shown in FIG. 4b, the correction signal $S_{COR}$ (graph 448) comprises a modulated component that is selected to match the modulated DC offset component output from the modulation circuit (graph 434).

FIG. 4b illustrates how circuit 400 corrects for the DC offset of the input signal $S_{IN}$ over a plurality of feedback cycles (e.g., 450, 452, and 454). As shown in FIG. 4b, during a first feedback cycle 450 a first correction signal $S_{COR}$ (graph 448) is determined to have a modulated signal waveform having a first amplitude. The first correction signal is subtracted from the output signal $S_{OUT}$ in the second feedback cycle 452 to result in an adjusted signal $S_{ADJ}$ (graph 434, feedback cycle 452) having a smaller DC offset. The smaller DC offset of the adjusted signal $S_{ADJ}$ in feedback cycle 452 results in an integrated signal $S_{INT}$ that has a smaller slope (e.g., slope 442 is smaller than slope 440). However, since a DC offset is still present in the adjusted signal $S_{ADJ}$, the correction signal $S_{COR}$ is further updated to have a modulated signal waveform having a second amplitude. The updated correction signal $S_{COR}$ is then subtracted from the output signal $S_{IN}$ in the third feedback cycle 454 to result in an adjusted signal $S_{ADJ}$ (graph 434, feedback cycle 454) having no DC offset. Since the updated correction signal $S_{COR}$ removes the DC offset from the output signal $S_{OUT}$, no modulated component is present in the adjusted signal $S_{ADJ}$ during the third feedback cycle 454. This causes the integrated signal $S_{INT}$ to have a zero slope causing the correction signal $S_{COR}$ to be held constant.

Therefore, as shown in FIGS. 3 and 4, the correction signal may be subtracted from the modulated input signal either upstream (e.g., FIG. 3) of the modulation circuit (e.g., as a DC offset correction signal having a constant DC value) or downstream (e.g., FIG. 4) of the modulation circuit (e.g., as a DC offset correction signal having a modulated value).

It will be appreciated that the signal output from the mixer clock (e.g., 318, 418) may comprise the clock signal at which the output signal $S_{OUT}$ is updated. In one embodiment, the mixer clock (e.g., 318, 418) may comprise the system clock. In an alternative embodiment, the mixer clock (e.g., 318, 418) may have a refresh rate that is lower than the system clock CLK. In such an embodiment, wherein the update clock rate of the mixer clock is lower than the system clock rate, the processing logic (e.g., 314, 414) may comprise a digital filter configured to provide the DAC with the correctly decimated data.

Figure 5:
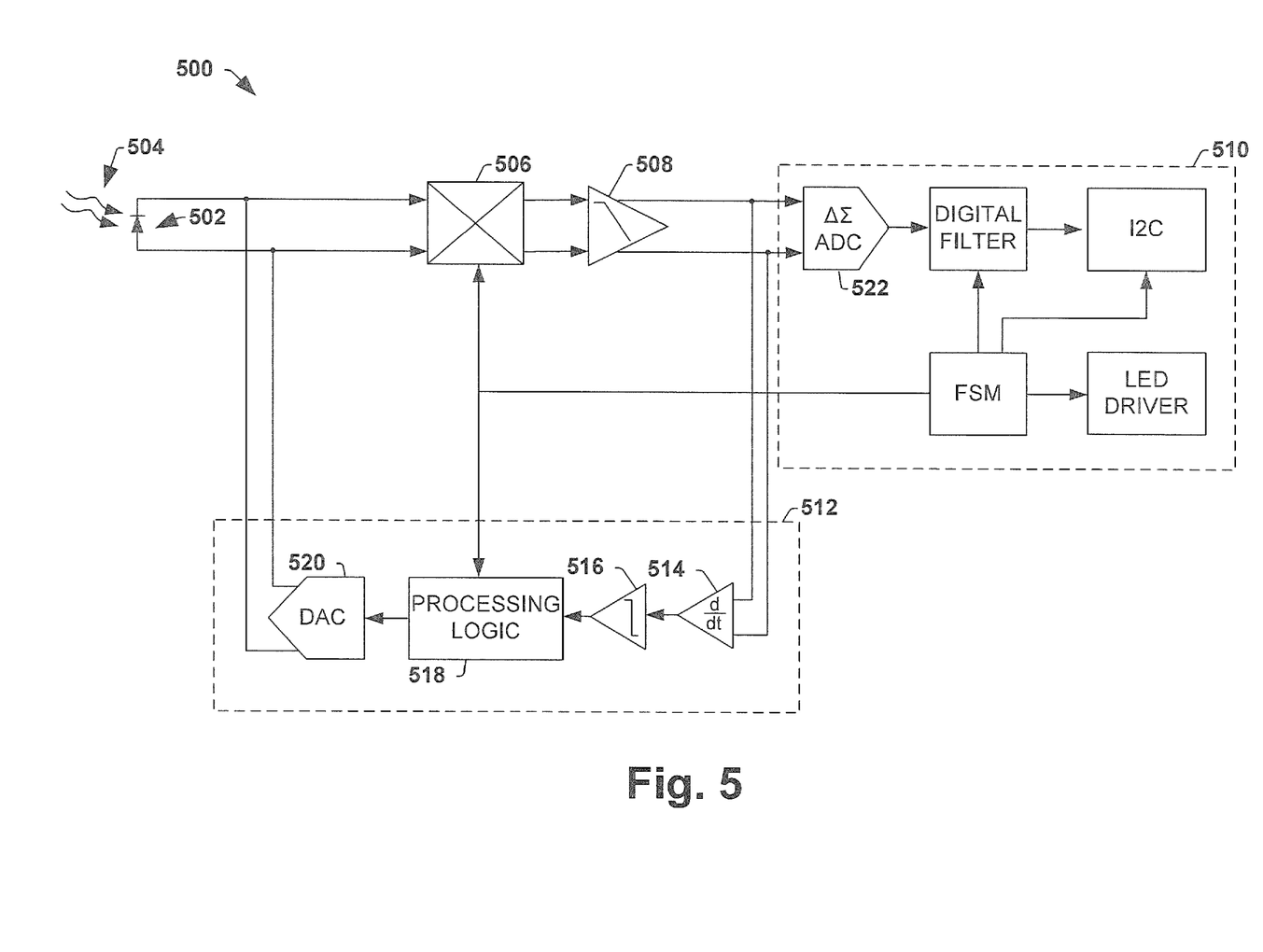
FIG. 5 illustrates a block diagram of an ambient light and proximity sensor circuit 500 that is configurable to track and correct a DC offset.

In one embodiment, the time domain DC offset correction circuit provided herein may be implemented in an ambient light and proximity sensor chip. FIG. 5 illustrates a block diagram of an ambient light and proximity sensor circuit 500 that is configurable to track and correct a DC offset. In such a system the proximity measurement may be achieved by measuring the photocurrent of an infrared photodiode 502 generated by reflection of a sequence of infrared light pulses 504 emitted by an infrared LED (not shown).

It will be appreciated that in addition to receiving infrared light pulses 504, the photodiode 502 will also receive ambient background light. While the infrared light pulses 504 may be converted by the photodiode 502 into a modulated signal, the ambient light component will be converted by the photodiode 502 into an unwanted DC offset, thereby resulting in a signal being output from the photodiode 502 having a modulated component (e.g., from infrared light pulses) and an unwanted DC offset component (e.g., from ambient background light).

As shown in FIG. 5, the photodiode 502 is connected differentially to a demodulator 506 configured to generate a demodulated current having a modulated component (e.g., generated from modulation of the DC offset of the ambient light). The output of the demodulator 506 is coupled to a voltage to current converter 508 comprising a low pass filter. The voltage to current converter 508 performs an approximate integration of the demodulated output signal resulting in an integrated voltage signal.

A feedback loop 512 comprising a differentiator 514 is configured to differentiate the integrated signal output from the voltage to current converter 508. The differentiator provides a differentiated signal to a comparator 516, which provides a comparator signal to processing logic 518. The processing logic outputs a sequence of digital code to a DAC 520, configured to generate a DC offset correction signal that cancel unwanted DC currents (e.g., generated by the detected ambient light) that are contained within the signal output from the photodiode 502. In one embodiment, the DAC 520 may comprise a charge pump that is configured to generate a current based upon the usage of digital signals, output from the processing logic 518, to create positive or negative charge pulses that are stored on a capacitor and from there to a voltage to current converter (e.g., a transconductance Gm cell).

In one embodiment, in order to avoid interference of external disturbers 510 the incoming signal may be demodulated with the same signal that drives the LED and is then converted by a sigma-delta analog to digital converter 522. In order to ensure correct biasing of the photodiode and optimize the performance of the ADC 522, the DC offset of the input signal should be removed. Any remaining DC offset at the input of the demodulator 506 would lead to an unwanted signal component showing up as a low pass filtered square wave on top of the desired signal at the output. The unwanted component is measured and suppressed as described above.

Figure 6:
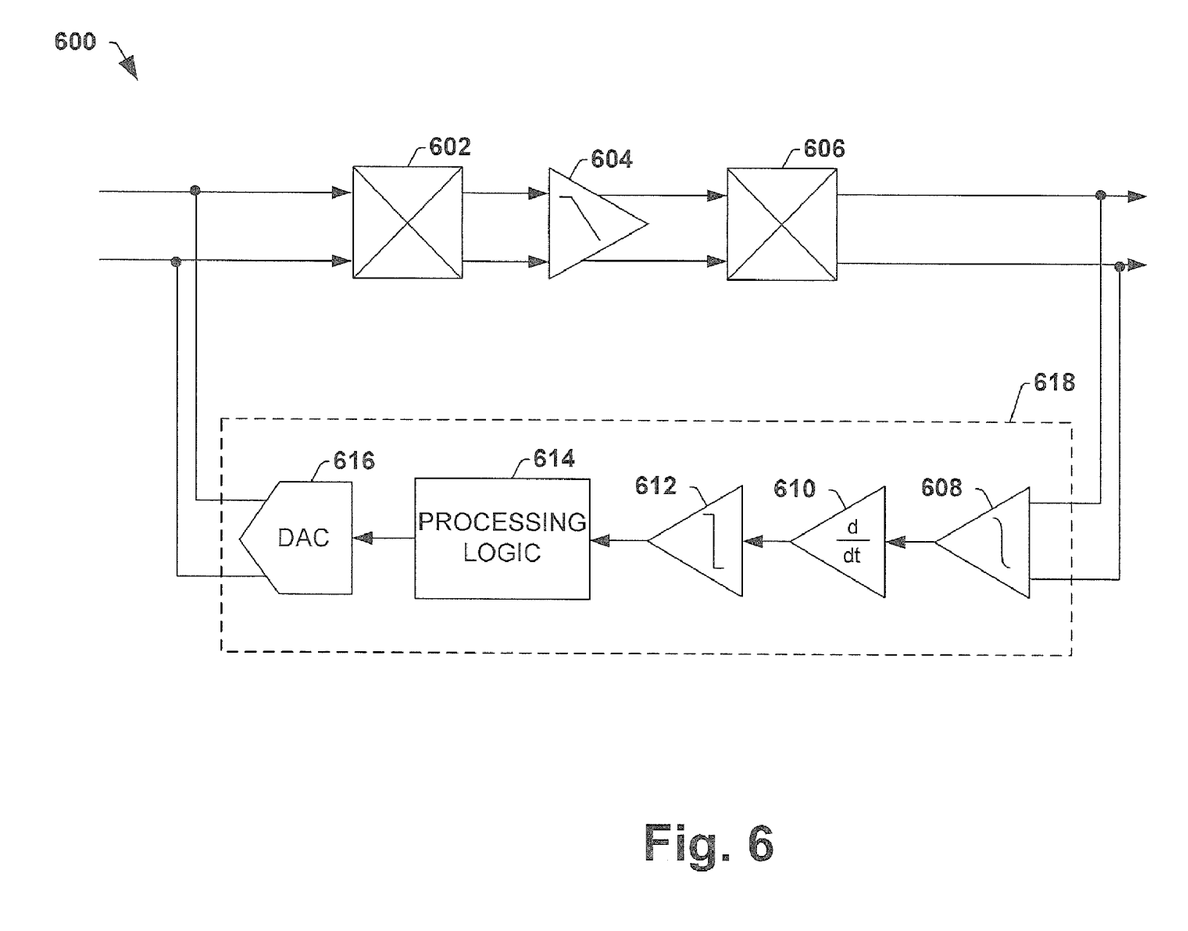
FIG. 6 illustrates an exemplary circuit 600 for suppressing harmonics generated by the use of a chopper amplifier.

One of ordinary skill in the art will appreciate that the time domain DC offset correction circuit provided herein may be applied to a wide range of applications. For example, in one embodiment, the proposed time domain DC offset correction circuit may be used to suppress unwanted harmonic tones generated by the modulated amplifier input offset when chopper offset cancellation is used. FIG. 6 illustrates an exemplary circuit 600 for suppressing harmonics generated by the use of a chopper amplifier.

As shown in FIG. 6, a chopper amplifier 602 if configured to modulate an offset of a differential input signal from a baseband to higher frequencies. For example, the chopper amplifier 602 may be configured to multiply the input signal by a square wave signal at a chopping frequency to effectively alternatively add an offset value (e.g., 10 mV) and an inverted offset value (e.g., −10 mV) to the input signal. Such chopping generates a modulated chopping signal at a chopping frequency, due to the swapping.

Typically a filter 604 (e.g., a low pass filter) may be used to remove the high frequency offset components prior to demodulation of the modulated chopping signal, back to the baseband, by a second chopper amplifier 606. However, if the modulated components of the chopping signal are not completely filtered by the filter 604 (e.g., if the chopping frequency is not high enough to be properly filtered), the components can cause an unwanted square wave signal component on top of the wanted components at the output of the second chopping amplifier 606.

As shown in FIG. 6, the chopping signal may be provided to the time domain DC offset correction circuit 618 comprising an integrator 608, a differentiator 610, and a comparator 612 coupled to processing logic 614 and a DAC 616 (e.g., a charge pump). The operation of the DC offset correction circuit can work as described above to remove the measure and remove unwanted square wave components of the chopping signal.

Figure 7:
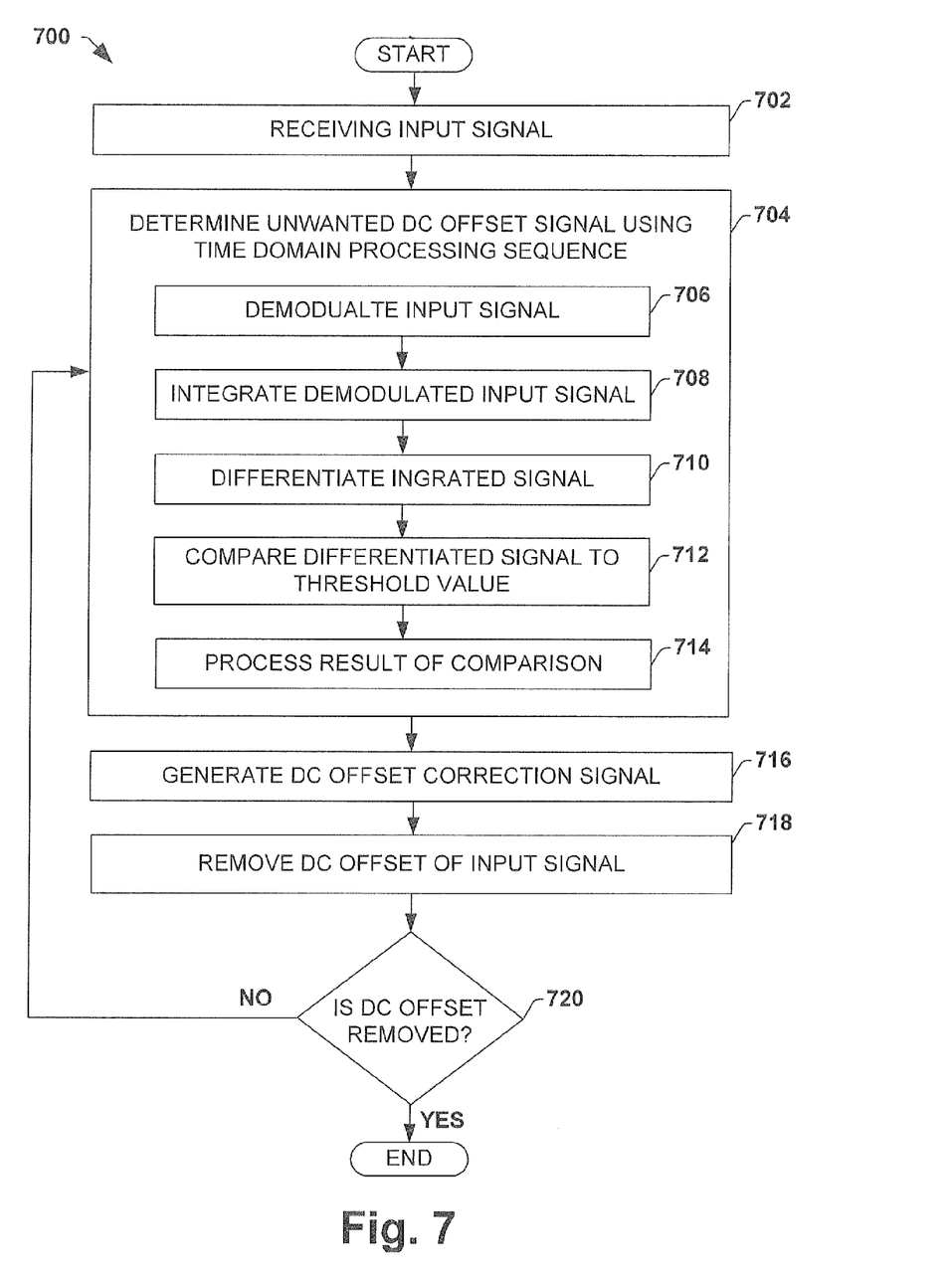
FIG. 7 illustrates a flow diagram of a method 700 for removing the DC offset of an input signal.

FIG. 7 illustrates a flow diagram of a method 700 for removing an unwanted DC offset from an input signal comprising a modulated component and a DC offset component.

While method 700 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

Furthermore, the claimed subject matter may be implemented as a method, apparatus, or article of manufacture using standard programming and/or engineering techniques to produce software, firmware, hardware, or any combination thereof to control a computer to implement the disclosed subject matter (e.g., the circuits shown in FIGS. 1, 3*a*, 4*a*, etc., are non-limiting examples of circuits that may be used to implement method 700). The term "article of manufacture" as used herein is intended to encompass a computer program accessible from any computer-readable device, carrier, or media. Of course, those skilled in the art will recognize many modifications may be made to this configuration without departing from the scope or spirit of the claimed subject matter.

At 702 an input signal having a DC offset component is received. The input signal input signal may comprise a modulated component and a DC offset component.

At 704 an unwanted DC signal is determined using a time domain processing sequence. In one embodiment described in more detail below, the unwanted DC offset signal is determined based upon a time domain processing sequence that uses a sequence of integration, differentiation, and comparison to iteratively generate a DC correction signal that is subtracted from an input signal having a DC offset component.

At 706 the modulated input signal is demodulated. Demodulation of an input signal having a DC offset component results the modulation of the DC offset component of such an demodulated output signal has a demodulated component (from the modulated component of the input signal) and a modulated component (from the DC offset component of the input signal).

The demodulated output signal is integrated at 708. In one embodiment, if a DC offset is present in the input signal, integration comprises integration of the area of the modulated components of the output signal to result in a triangular shaped waveform that that varies in time. In particular, such an integrated signal will comprise a positive slope when the demodulated output signal comprises a positive polarity and a negative slope when the demodulated output signal comprises a negative polarity.

At 710 the integrated signal is differentiated. In one embodiment, wherein a DC offset is present in the input signal $S_{IN}$ differentiation comprises differentiating the triangular waveform of the integrated signal to result in a square waveform having an alternating positive or negative value (e.g., positive value when the integrated signal has a positive "upward" slope, and a negative value when the integrated signal has a negative "downward" slope).

At 712 the differentiated signal is compared to a threshold value. Comparison of the differentiated signal to threshold value results in a signal indicating whether or not the slope of the integrated signal is substantially zero. For example, if the slope of the integrated signal is substantially zero (indicating a zero DC offset at the input signal) the differentiated signal will be a substantially flat signal and the comparison will provide a single value signal. However, if the slope of the integrated signal is not zero (indicating a DC offset at the input signal) the differentiated signal will not be a flat signal and the comparison will provide a two value signal.

At 714 the result of the comparison is processed to determine a digital signal associated with an estimated DC offset value. In one embodiment, processing may comprise processing the result of the comparison in a single phase of the demodulation. In an alternative embodiment, processing may comprise multiplying the result of the comparison by the phase of demodulation (e.g., a clock signal used for demodulation) to generate a modified comparator signal. In such an embodiment, if the slope of the integrated signal is substantially zero (indicating a zero DC offset at the input signal) the differentiated signal will be a substantially flat signal (e.g., a signal that rises and falls a small amount that is not detectable by a comparator within a single clock cycle). Comparison of the substantially flat signal to a threshold value will result in a single value that can be multiplied by the clock signal to generate a modified comparator signal that is positive 50% of the time and negative 50% of the time. However, if the slope of the integrated signal is not zero (indicating a DC offset at the input signal) the differentiated signal will not be a flat signal. Comparison of the not flat signal to a threshold value will result in a signal that when multiplied by the clock signal generates a modified comparator signal that is positive/negative a larger portion of time than it is negative/positive.

A DC offset correction signal is generated at 716. The DC offset correction signal may be generated based upon the digital signals generated by the modified comparator signal.

The DC offset of the input signal is removed at 718. In one embodiment, the DC offset correction signal (e.g., a DC offset correction signal having a constant DC value) is subtracted from the input signal to remove the DC offset component of the input signal. In an alternative embodiment, the DC offset correction signal (e.g., a DC offset correction signal having a modulated value) may be modulated and then subtracted from the demodulated output signal to remove the DC offset component of the input signal.

Decision box 716 queries if the DC offset of the input signal has been removed. If the DC offset has been removed, the process is over and the adjusted input signal comprises substantially no DC offset signal. If the DC offset has not been removed, the process may repeated, by once again determining the unwanted DC offset signal with the time domain processing sequence.

Although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements and/or resources), the terms used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the disclosure. In addition, while a particular feature of the disclosure may have been disclosed with respect to only one of several implementations, such feature may be combined with one or more other features of the other implementations as may be desired and advantageous for any given or particular application. In addition, the articles "a" and "an" as used in this application and the appended claims are to be construed to mean "one or more".

Furthermore, to the extent that the terms "includes", "having", "has", "with", or variants thereof are used in either the detailed description or the claims, such terms are intended to be inclusive in a manner similar to the term "comprising".

What is claimed is:

1. A circuit, comprising:
   a modulation circuit configured to process a modulated input signal having a DC offset component, and to demodulate the DC offset component of the modulated input signal to generate an output signal having a modulated component;
   a time domain DC offset correction circuit coupled to the modulation circuit and configured to apply a time domain processing sequence to the output signal to generate a DC offset correction signal based only upon measurements of the modulated component of the output signal, wherein the DC offset correction signal comprises an estimate of the DC offset component of the modulated input signal; and
   an adder coupled to the time domain DC offset correction circuit and configured to receive the DC offset correction signal and to remove the estimate of the DC offset component of the modulated input signal.

2. The circuit of claim 1, wherein the time domain DC offset correction circuit comprises:
   an integration component configured to receive and integrate the output signal to generate an integrated signal, wherein the integrated signal comprises a non-zero slope if the DC offset component is present in the modulated input signal;
   a differentiator configured to receive and differentiate the integrated signal to generate a differentiated signal, wherein the differentiated signal is indicative of the slope of the integrated signal; and
   a comparator configured to receive the differentiated signal and to generate a comparator signal from the differentiated signal, wherein the comparator signal is indicative of a polarity of the differentiated signal.

3. The circuit of claim 2, wherein the integrated signal comprises a waveform having a substantially zero slope from a removal of the DC offset component of the modulated input signal.

4. The circuit of claim 2, further comprising:
   processing logic configured to receive the comparator signal and to generate a sequence of digital signals based on the comparator signal; and
   a digital to analog converter (DAC) configured to receive the sequence of digital signals and to generate the DC offset correction signal from the sequence of digital signals.

5. The circuit of claim 4, wherein the DAC comprises a charge pump.

6. The circuit of claim 4, wherein the processing logic comprises a combinatorial logic configured to multiply the comparator signal with a phase of output signal to generate a modified comparator signal for processing, wherein if the modified comparator signal has a substantially even distribution of positive and negative values no DC offset is present and wherein if the modified comparator signal has a non-even distribution of positive and negative values a DC offset is present.

7. The circuit of claim 4, wherein the processing logic is operated in a single phase of the modulation circuit.

8. The circuit of claim 4, further comprising:
an additional modulation circuit coupled to the output of the DAC and configured to modulate a DC offset correction signal to generate a modulated DC offset correction signal,
wherein the modulated DC offset correction signal is provided to the adder, wherein the adder is configured downstream of the modulation circuit.

9. The circuit of claim 1, wherein the circuit is configured to iteratively correct the DC offset of the modulated input signal through discretely adjusting the DC offset correction signal.

10. The circuit of claim 1, wherein the DC offset correction signal comprises a constant value DC signal that is provided to the adder, wherein the adder is configured upstream of the modulation circuit.

11. The circuit of claim 1, wherein the circuit comprises an ambient light and proximity sensor circuit, and wherein the modulated input signal comprises a photocurrent of an infrared photodiode, and wherein the DC offset component is generated by ambient light received by the photodiode.

12. The circuit of claim 1, further comprising:
a first chopper amplifier configured to generate a modulated chopping signal at a chopping frequency having an unwanted square wave component;
wherein the modulated chopping signal is provided to the time domain DC offset correction circuit, and wherein the time domain DC offset correction circuit is configured to measure and remove unwanted square wave components of the chopping signal.

13. A method for removing a DC offset component from a modulated signal, comprising:
demodulating a modulated input signal having a DC offset component to generate a demodulated output signal having a modulated component;
integrating the demodulated output signal to generate an integrated signal indicating an area of the output signal;
differentiating the integrated signal to generate a differentiated signal indicative of a slope of the integrated signal;
comparing the differentiated signal to a predetermined threshold to generate a comparator signal indicative of a polarity of the differentiated signal;
generating a DC offset correction signal comprising an estimate of the DC offset of the modulated input signal based upon the comparator signal; and
removing the DC offset component by subtracting the DC offset correction signal from the modulated input signal before or after demodulation.

14. The method of claim 13, further comprising demodulating the DC offset correction signal to generate a modulated DC offset correction signal that is subtracted from the demodulated output signal.

15. The method of claim 13, further comprising processing the comparator signal by multiplying the comparator signal with a phase of the output signal to generate a modified comparator signal for processing, wherein if the modified comparator signal has a substantially even distribution of positive and negative values no DC offset is present and wherein if the modified comparator signal has a non-even distribution of positive and negative values a DC offset is present.

16. The method of claim 13, wherein the integrated signal comprises a triangular waveform when a DC offset component is present in the modulated input signal and wherein the integrated signal comprises a substantially zero slope when the DC offset component is not present in the modulated input signal.

17. A DC offset correction circuit, comprising
a modulation circuit configured to receive a modulated input signal having a DC offset component, and to modulate the DC offset component of the modulated input signal to generate an output signal having a modulated component;
an integration component configured to receive and integrate the output signal to generate an integrated signal, wherein the integrated signal comprises a non-zero slope if the DC offset component is present in the modulated input signal;
a differentiator configured to receive and differentiate the integrated signal to generate a differentiated signal, wherein the differentiated signal is indicative of the slope of the integrated signal;
a comparator configured to receive the differentiated signal and to generate a comparator signal from the differentiated signal, wherein the comparator signal is indicative of a polarity of the differentiated signal;
a processing logic configured to receive the comparator signal and to generate a sequence of digital signals based on the comparator signal, wherein the processing logic comprises a combinatorial logic configured to multiply the comparator signal with a phase of the output signal to generate a modified comparator signal for processing, wherein if the modified comparator signal has a substantially even distribution of positive and negative values no DC offset is present and wherein if the modified comparator signal has a non-even distribution of positive and negative values a DC offset is present;
a digital to analog converter (DAC) comprising a charge pump configured to receive the sequence of digital signals and to generate a DC offset correction signal from the sequence of digital signals; and
an adder configured to receive the DC offset correction signal and to remove an estimate of the DC offset of the modulated input signal.

18. The DC offset correction circuit of claim 17, wherein the DC offset correction signal comprises a constant value DC signal that is provided to the adder, wherein the adder is configured upstream of the modulation circuit.

19. The DC offset correction circuit of claim 17, further comprising:
an additional modulation circuit coupled to the output of the DAC and configured to modulate a DC offset correction signal to generate a modulated DC offset correction signal,
wherein the modulated DC offset correction signal is provided to the adder, wherein the adder is configured upstream of the modulation circuit.

20. The DC offset correction circuit of claim 17, wherein the circuit comprises an ambient light and proximity sensor circuit, and wherein the modulated input signal comprises a photocurrent of an infrared photodiode, and wherein the DC offset component is generated by ambient light received by the photodiode.

21. A circuit, comprising:
a modulation circuit configured to process a modulated input signal having a DC offset component, and to demodulate the DC offset component of the modulated input signal to generate an output signal having a modulated component;
a DC offset correction circuit coupled to the modulation circuit and configured to generate a DC offset correction signal comprising an estimate of the DC offset component of the modulated input signal, wherein the DC offset correction circuit comprises:

an integration component configured to receive and integrate the output signal to generate an integrated signal, wherein the integrated signal comprises a non-zero slope if the DC offset component is present in the modulated input signal;

a differentiator configured to receive and differentiate the integrated signal to generate a differentiated signal, wherein the differentiated signal is indicative of the slope of the integrated signal;

a comparator configured to receive the differentiated signal and to generate a comparator signal from the differentiated signal, wherein the comparator signal is indicative of a polarity of the differentiated signal; and a summation element coupled to the DC offset correction circuit and configured to receive the DC offset correction signal and to remove the estimate of the DC offset component of the modulated input signal.

* * * * *